(12) United States Patent
Ong et al.

(10) Patent No.: US 7,595,982 B2
(45) Date of Patent: Sep. 29, 2009

(54) LOW AIRFLOW IMPEDANCE PCBA HANDLING DEVICE

(75) Inventors: Brett C. Ong, San Jose, CA (US);
Timothy W. Olesiewicz, Dublin, CA (US); Clifford B. Willis, Tracy, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 41 days.

(21) Appl. No.: 11/950,258

(22) Filed: Dec. 4, 2007

(65) Prior Publication Data

US 2009/0141443 A1 Jun. 4, 2009

(51) Int. Cl.
*H05K 7/20* (2006.01)
*B60H 1/00* (2006.01)

(52) U.S. Cl. .................. 361/679.49; 361/695; 361/697; 29/830; 29/832

(58) Field of Classification Search .................. 361/687, 361/690–697, 715–724; 174/15.1, 16.3, 174/252; 165/80.3, 104.33, 121–122, 185; 454/184; 29/559, 740, 741, 744, 764, 758, 29/830, 832, 843
See application file for complete search history.

(56) References Cited

U.S. PATENT DOCUMENTS

| | | | | |
|---|---|---|---|---|
| 5,495,389 A * | 2/1996 | Dewitt et al. | ........... | 361/679.57 |
| 5,566,377 A * | 10/1996 | Lee | ............................. | 361/695 |
| 6,134,108 A * | 10/2000 | Patel et al. | .................. | 361/695 |
| 6,215,659 B1 * | 4/2001 | Chen | ........................... | 361/695 |
| 6,400,568 B1 * | 6/2002 | Kim et al. | .................... | 361/697 |
| 6,442,024 B1 * | 8/2002 | Shih | ........................... | 361/695 |
| 6,462,948 B1 * | 10/2002 | Leija et al. | .................... | 361/697 |
| 6,525,936 B2 * | 2/2003 | Beitelmal et al. | ........... | 361/695 |
| 6,643,131 B1 * | 11/2003 | Huang | ........................ | 361/697 |
| 6,654,244 B2 * | 11/2003 | Laufer et al. | ................ | 361/695 |
| 6,736,196 B2 * | 5/2004 | Lai et al. | ..................... | 165/122 |
| 6,791,837 B2 * | 9/2004 | Chen et al. | .................. | 361/695 |
| 6,813,149 B2 * | 11/2004 | Faneuf et al. | .......... | 361/679.49 |
| 6,876,549 B2 * | 4/2005 | Beitelmal et al. | ........... | 361/692 |
| 7,079,388 B2 * | 7/2006 | Faneuf et al. | .......... | 361/679.51 |
| 7,123,478 B2 * | 10/2006 | Chen | ........................... | 361/695 |
| 7,168,918 B2 * | 1/2007 | Balan et al. | ............. | 415/208.2 |
| 7,204,750 B2 * | 4/2007 | Shen et al. | .................. | 454/184 |
| 7,209,352 B2 * | 4/2007 | Chen | ........................... | 361/695 |
| 7,248,472 B2 * | 7/2007 | Vinson et al. | ............... | 361/694 |
| 7,251,136 B2 * | 7/2007 | Yang et al. | .................. | 361/695 |
| 7,286,350 B2 * | 10/2007 | Lee et al. | .................... | 361/695 |
| 7,304,844 B2 * | 12/2007 | Jan et al. | ..................... | 361/697 |
| 7,361,081 B2 * | 4/2008 | Beitelmal et al. | ........... | 454/184 |
| 2007/0117502 A1 * | 5/2007 | Kim | ........................... | 454/139 |

* cited by examiner

*Primary Examiner*—Michael V Datskovskiy
(74) *Attorney, Agent, or Firm*—Osha • Liang LLP

(57) ABSTRACT

A computer server includes a printed circuit board and a fan. The printed circuit board includes electronic components and a handling device mounted thereon. The fan is arranged to blow air across the electronic components mounted on the printed circuit board. The handling device is disposed in a path of airflow of the fan. The handling device comprises an airflow opening.

12 Claims, 4 Drawing Sheets

LOW AIRFLOW IMPEDANCE PCBA HANDLING DEVICE

BACKGROUND OF INVENTION

As computer systems become more complex, printed circuit board assemblies (PCBAs), e.g., server motherboards, have become increasingly dense with wiring and electronic components. The increased density makes the PCBAs more fragile and susceptible to damage during assembly and testing. Thus, in order to facilitate insertion or removal of a PCBA, a handle is typically mounted along with the various electronic components.

One important consideration with these handles is space. While most workstations are large enough to accommodate motherboard stiffeners or trays, smaller products such as 1U or 2U blade servers are more constrained due to their limited height.

FIG. 1 shows a perspective view of a motherboard 100 having a typical handle 120, which is essentially a mushroom-shaped body. The handle 120, fans 110, and electronic components 130 are mounted on a top surface of the motherboard 100. The fans 110 blow air across the electronic components 130 in order to cool the electronic components 130 such that a prescribed operating temperature can be maintained.

SUMMARY OF INVENTION

In general, in accordance with one or more embodiments of the present invention, a computer server comprises: a printed circuit board comprising electronic components and a handling device mounted thereon; and a fan arranged to blow air across the electronic components mounted on the printed circuit board, wherein the handling device is disposed in a path of airflow of the fan, and wherein the handling device comprises an airflow opening.

Other aspects and advantages of the invention will be apparent from the following description and the appended claims.

DETAILED DESCRIPTION

Exemplary embodiments of the invention will be described with reference to the accompanying figures. Like items in the figures are shown with the same reference numbers.

In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

Figure 1:
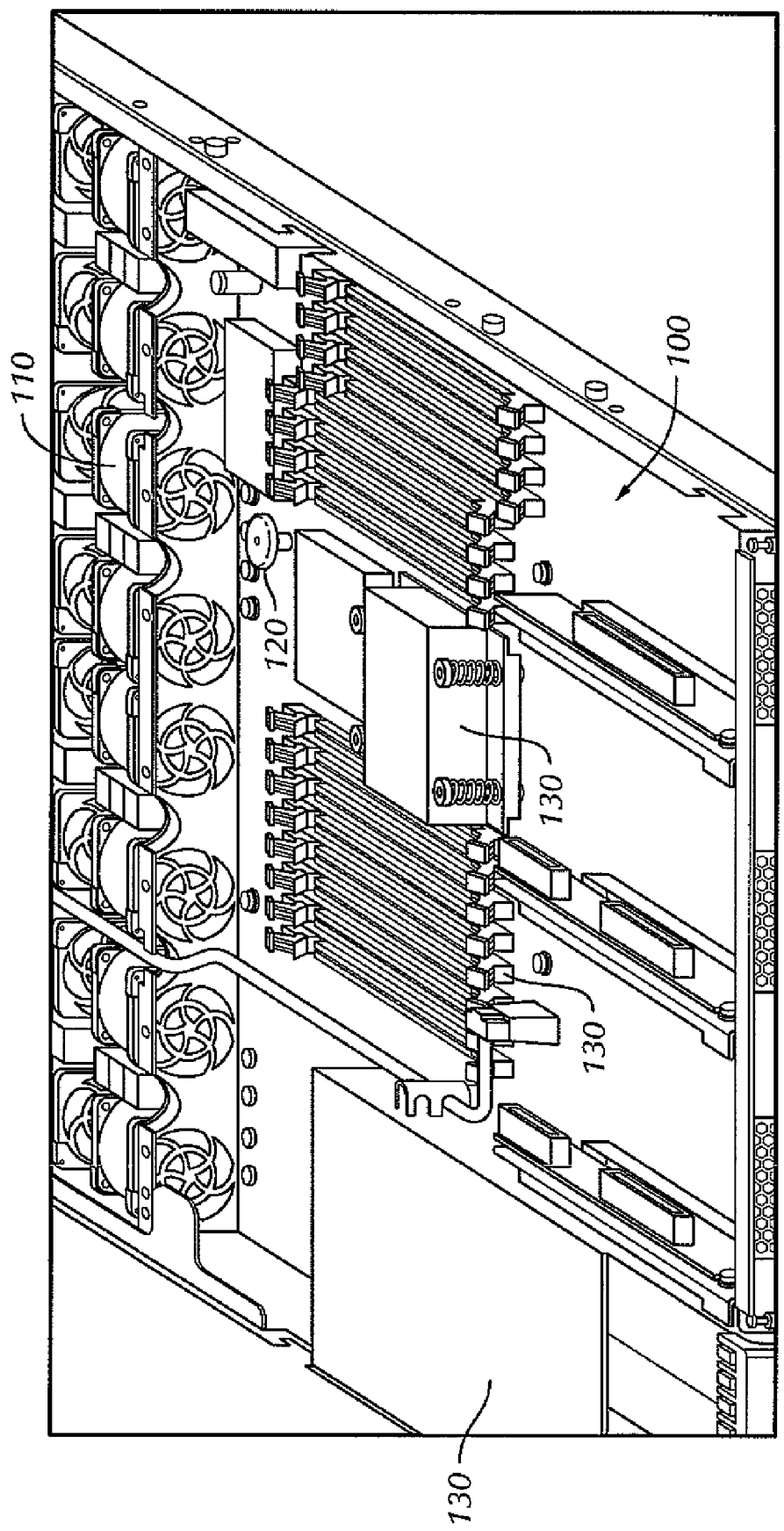
FIG. 1 shows a perspective view of a motherboard with a typical handle.
Figure 2:
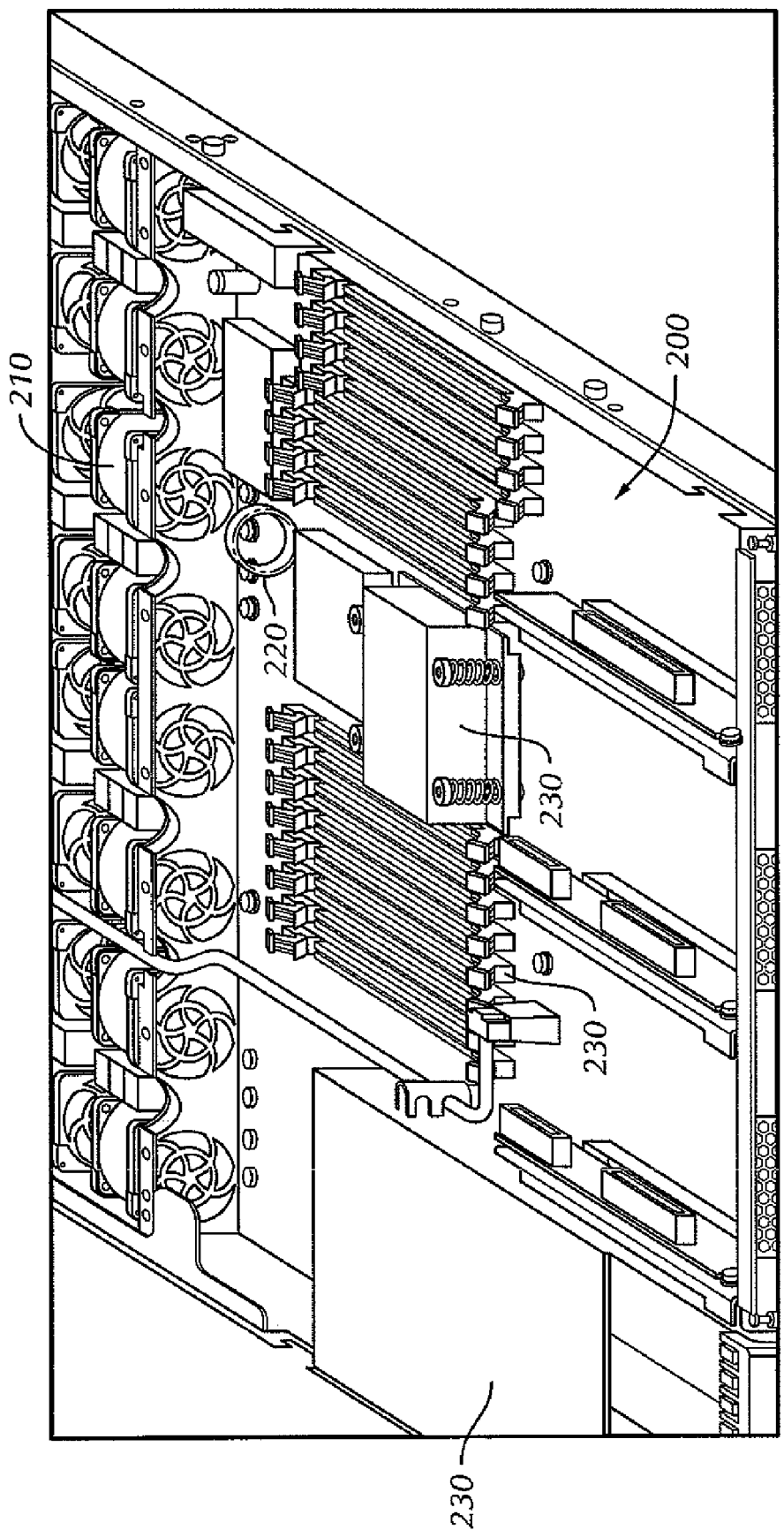
FIG. 2 shows a perspective view of a PCBA with a low airflow impedance handling device in accordance with one or more embodiments of the present invention.

FIG. 2 shows a printed circuit board assembly (PCBA) in a computer server 199 according to one or more embodiments of the present invention. Electronic components 230 and a handling device 220 are mounted on a surface of a printed circuit board 200. The printed circuit board 200 may be, e.g., a motherboard. Fans 210 are disposed in the computer server 199 and arranged to blow air across the electronic components 230 mounted on the printed circuit board 200. The handling device 220 is located in a path of airflow of the fans 210 between the fans 210 and at least one of the electronic components 230. As can be seen, the handling device 220 has an airflow opening. In one or more embodiments, the airflow opening of the handling device 220 faces the front of the fans 210, which allows the air from the fans 210 to flow through the airflow opening. As a result, the air from the fans flows toward the electronic components 230 with less impedance.

In accordance to one or more embodiments of the present invention, the electronic components may comprise a variety of electronic elements. In one embodiment, the electronic components 230 may comprise a central processing unit, memory, and input/output components. Types and combinations of electronic elements may be varied to suit the particular requirements of the PCBA.

Figure 3:
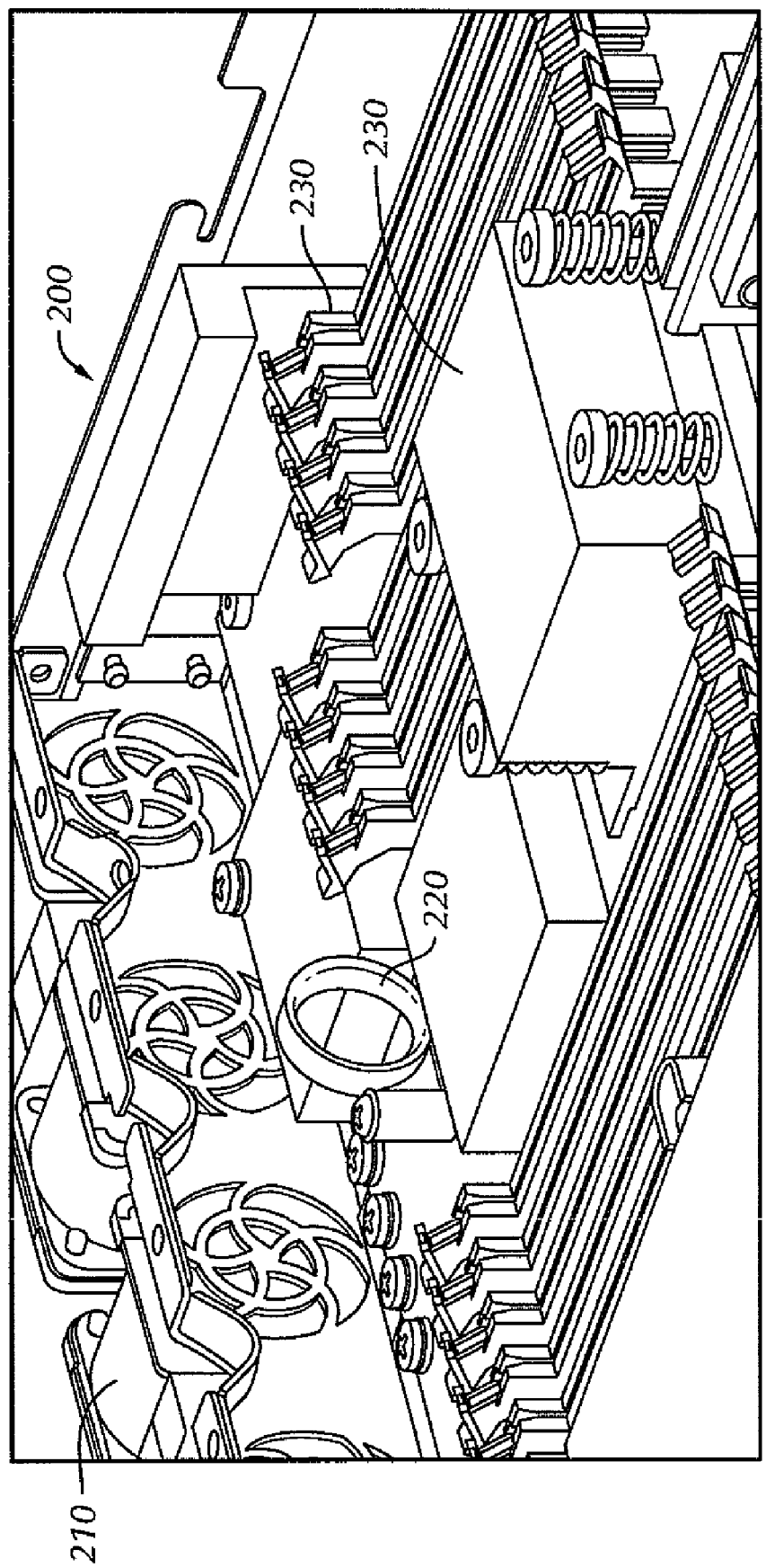
FIG. 3 shows a close-up view of the low airflow impedance handling device shown in FIG. 2.

FIG. 3 is a close-up view of the handling device 220 shown in FIG. 2. The handling device 220 is shaped to allow a user to insert a finger into the airflow opening, grasp the handling device, and manually insert the printed circuit board 200 into or remove the printed circuit board 200 from the computer server 199. The computer server 199 may be, e.g., a 1U or 2U blade server.

Figure 4:
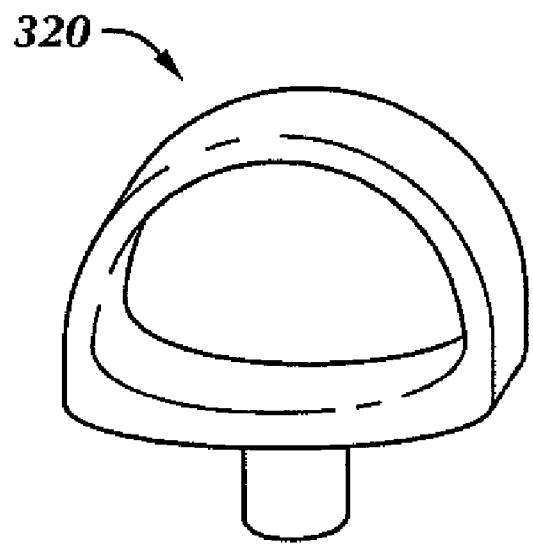
FIG. 4 shows a perspective view of a low airflow impedance handling device in accordance with one or more embodiments of the present invention.

The handling device 220 may have a smooth, rounded surface, which creates a smaller cross-section and allows the air to flow through the airflow opening more easily. The handling device 220 may be tapered in a direction of the path of airflow from the fans to reduce airflow impedance. The handling device 220 may take various suitable shapes and forms. The handling device 220 as shown in FIGS. 2 and 3 has a circular ring. The handling device 320 shown in FIG. 4 has a D-shaped ring.

Figure 5:
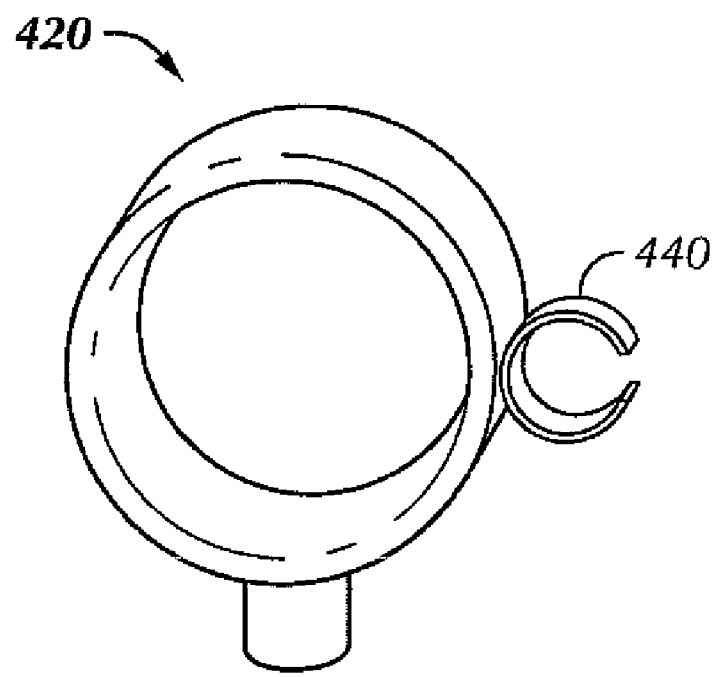
FIG. 5 shows a perspective view of a low airflow impedance handling device having cable management features in accordance with one or more embodiments of the present invention.

In one or more embodiments of the present invention, additional features may be integrated to the handling device. FIG. 5 shows a handling device 420 comprising a cable management device 440. As can be seen, the cable management device 440 secures and routes a cable on the surface of the printed circuit board.

Advantages of the present invention, in accordance with one or more embodiments, may include one or more of the following. The airflow opening of the handling device 220 improves airflow across the surface of the printed circuit board 200 and minimizes turbulence and airflow impedance. As a result, heat generated from the electronic components 230 is dissipated more efficiently, which facilitates the maintaining of appropriate operating temperatures for the electronic components. The smooth, rounded surface of the handling device 220 reduces turbulence and provides a comfortable handling surface for a user. Due to the small size and surface area of the handling device 220, the handling device does not take up much space. The low airflow impedance characteristics of the handling device 220 allow for greater placement flexibility of the handling device 220 on the surface of printed circuit board 200. The handling device 220 allows integration of optional upgrade features to cater to unique requirements for individual platforms.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A computer server, comprising:
   a printed circuit board comprising electronic components and a printed circuit board handling device mounted thereon; and
   a fan arranged to blow air across the electronic components mounted on the printed circuit board,
   wherein the handling device is disposed in a path of airflow of the fan, and
   wherein the handling device comprises an airflow opening.

2. The computer server of claim 1 wherein the computer server is a blade server.

3. The computer server of claim 2, wherein the blade server has a 1U height.

4. The computer server of claim 2, wherein the blade server has a 2U height.

5. The computer server of claim 1, wherein the electronic components comprise a central processing unit, memory, and input/output components.

6. The computer server of claim 1, wherein the handling device comprises a circular ring.

7. The computer server of claim 1, wherein the handling device comprises a D-shaped ring.

8. The computer server of claim 1, wherein the airflow opening is tapered in a direction of the path of airflow of the fan.

9. The computer server of claim 1, wherein the handling device is disposed in between the fan and at least one of the electronic components mounted on the printed circuit board.

10. The computer server of claim 1, wherein the printed circuit board is a motherboard.

11. The computer server of claim 1, wherein the handling device comprises a cable management device.

12. The computer server of claim 1, further comprising a plurality of fans.

* * * * *